United States Patent

Engeler

[15] 3,685,140

[45] Aug. 22, 1972

[54] SHORT CHANNEL FIELD-EFFECT TRANSISTORS

[72] Inventor: William E. Engeler, Scotia, N.Y.

[73] Assignee: General Electric Company

[22] Filed: Oct. 3, 1969

[21] Appl. No.: 863,654

[52] U.S. Cl. ........................29/571, 29/578, 148/188

[51] Int. Cl. ..........................B01j 17/00, H01g 13/00

[58] Field of Search....29/571, 589, 590, 591, 576 T, 29/578

[56] References Cited

UNITED STATES PATENTS

| | | | |
|---|---|---|---|
| 3,456,168 | 7/1969 | Tatom | 29/571 |
| 3,514,844 | 6/1970 | Bower et al. | 29/590 |
| 3,354,008 | 11/1967 | Brixey Jr. et al. | 148/187 |
| 3,418,181 | 12/1968 | Robinson | 148/187 |
| 3,475,234 | 10/1969 | Kerwin et al. | 29/571 X |

*Primary Examiner*—John F. Campbell
*Assistant Examiner*—W. Tupman
*Attorney*—John F. Ahern, Paul A. Frank, Jerome C. Squillaro, Frank L. Neuhauser, Oscar B. Waddell and Joseph B. Forman

[57] ABSTRACT

An improved field-effect transistor having an exceedingly short channel length is described wherein a single edge defines the boundaries of both the source and drain regions. In one embodiment a gate electrode is formed over a thin oxide layer deposited on a semiconductor wafer of a first-conductivity type. An opposite-conductivity type impurity is diffused into the wafer adjacent the gate electrode. A first-conductivity-type impurity is diffused within the opposite-conductivity-type region forming a field-effect transistor having one edge of the gate electrode defining the boundary between the source and channel and the drain and channel regions. In another embodiment an edge of an insulating layer defines the boundaries of the source and drain regions. A method for fabricating isolated resistance elements is also disclosed.

12 Claims, 10 Drawing Figures

Inventor:
William E. Engeler,
by Jerome C. Squillaro
His Attorney.

Inventor:
William E. Engeler,
by Jerome C. Squillaro
His Attorney.

Inventor:
William E. Engeler,
by Jerome C. Squillaro
His Attorney.

Inventor:
William E. Engeler,
by James C. Squillaro
His Attorney.

SHORT CHANNEL FIELD-EFFECT TRANSISTORS

The present invention relates to improved field-effect transistors and methods for making the same. More particularly, the present invention relates to self-registered field-effect transistors having exceedingly short channel lengths.

Insulated gate field-effect transistors, in general, include a pair of opposite-conductivity-type regions adjacent a major surface of a first-conductivity-type semiconductor material wherein the discrete regions, known as source and drain, are separated by a small-dimension channel region over which an overlapping gate electrode is positioned. Conduction between the two regions occurs through the surface-adjacent portions of the channel region between the two regions. This surface channel is formed and modulated by a potential applied to the gate electrode. The length (longitudinal dimension of the separation) of the channel between the two regions defines an exceedingly important parameter in the operation of a field-effect transistor. For a given channel width, the transconductance is inversely proportional to the length of the channel. Therefore a device having a given transconductance can be made physically smaller if the length of the channel can be reduced. This would not only decrease the gate capacity directly, but also reduce lead capacity between associated devices in an integrated circuit. Additionally, smaller devices could be more compactly arranged which would in general lead to improved yields. Further, since the ultimate frequency of operation of the field-effect transistor is limited by the channel transit time which is proportional to the channel length, by reducing the length of the channel, the ultimate frequency of operation could be increased.

Conventional field-effect transistor devices, however, have been limited to channel lengths of the order of 10 microns. This is due primarily to mask alignment tolerances. A technique to substantially reducing the gate length is disclosed in a co-pending application, Ser. No. 679,957 now U.S. Pat. No. 3,566,518, to D. Brown and W. Engeler, which is assigned to the present assignee. Field-effect transistors made in accord with the teachings of the foregoing application have channel lengths as small as 3 microns. By the very nature of photolithographic techniques, shorter channel lengths can be achieved, but with great difficulty and uncertainty; the limit being the resolution of the photolithographic mask.

With the increasing desirability to replace vacuum tubes and bipolar transistors with field-effect transistors, there is a need for field-effect transistors with high gain-bandwidth products and high transconductance.

Accordingly, among the objects of the present invention are to provide improved field-effect transistors having high gain-bandwidth products, high transconductance and small physical size.

Another object of the invention is to provide a method for fabricating field-effect transistors wherein the channel length is not limited by photolithographic techniques.

Still another object of the present invention is to provide field-effect transistors having exceedingly short channel lengths.

Yet another object is to provide integrated circuits utilizing short channel field-effect devices.

Still another object is to provide a method for fabricating isolated resistance elements either as part of an integrated circuit or as discrete devices.

Briefly, these and other objects of the invention are achieved by fabricating field-effect transistors wherein a single edge of the gate electrode defines the limits of the source and drain channel regions for particular diffusion conditions. In accord with one embodiment of the invention, a gate electrode is formed by depositing a metal over a thin oxide overlying a semiconductor wafer of a first-conductivity-type material and patterning the metal by by photolithographic techniques. A first impurity is then is then diffused through the thin oxide layer into the semiconductor substrate adjacent a channel-defining edge of the gate electrode to form a "-substrate" region. A second type impurity is then diffused within the first diffusion region and also adjacent the channel-defining edge of the gate electrode to form a drain region. The channel-defining edge of the gate electrode therefore defines the origin of both diffusants into the semiconductor wafer. The length of the channel between the source and drain regions thus formed is equal to the difference in extent of lateral diffusions under the gate electrode. Since diffusion depths are controllable to fractions of a micron by conventional techniques, channel regions less than a micron can be formed. Isolated resistance elements useful in forming integrated circuits can also be fabricated with the same process.

In accord with another embodiment of the invention, field-effect transistors are fabricated on a semiconductor wafer having a thick oxide coating thereon with a gate electrode overlying a region of a thinner oxide layer. A hole is etched through the thin oxide layer at the channel-defining edge of the gate electrode and impurities are diffused through the hole so that differing conductivity regions are formed. In this embodiment, the oxide-edge under the gate electrodes defines the lateral extent of the diffusants and locates the short channel region.

The novel features believed characteristic of the present invention are set forth in the appended claims. The invention itself, together with further objects and advantages thereof, may best be understood by reference to the following detailed description taken in connection with the appended drawing in which;

FIG. 1 is a flow diagram of a method for fabricating a field-effect transistor in accord with one embodiment of the present invention;

FIG. 2*a–k* is a series of schematic illustrations of a vertical cross-section of a semiconductor wafer in the process of fabricating a field-effect transistor in accord with the method of the flow diagram of FIG. 1, each illustration corresponding to one of the process steps in the diagram of FIG. 1;

FIG. 3 is a flow diagram of a method for fabricating a field-effect transistor in accord with another embodiment of the present invention.

FIG. 4*a–l* is a series of schematic illustrations of a vertical cross-section of a semiconductor wafer in the process of fabricating a field-effect transistor in accord with the method of the flow diagram of FIG. 3, each illustration corresponding to one of the process steps in the diagram of FIG. 3;

Figure 1:
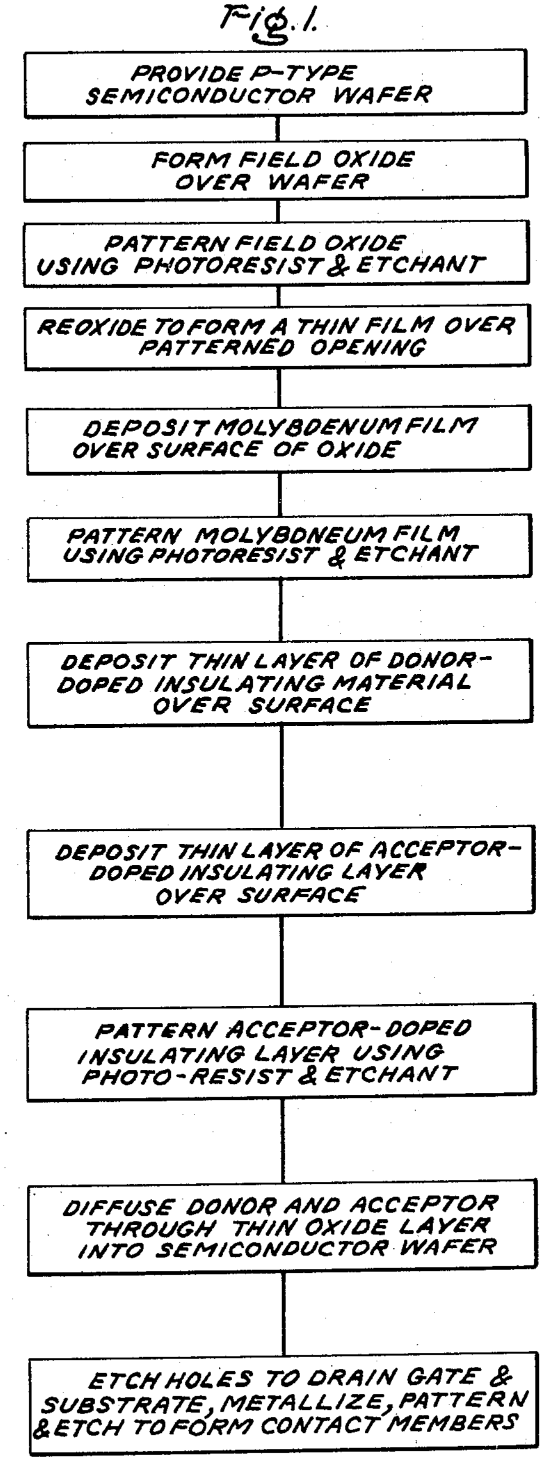
Figure 2:
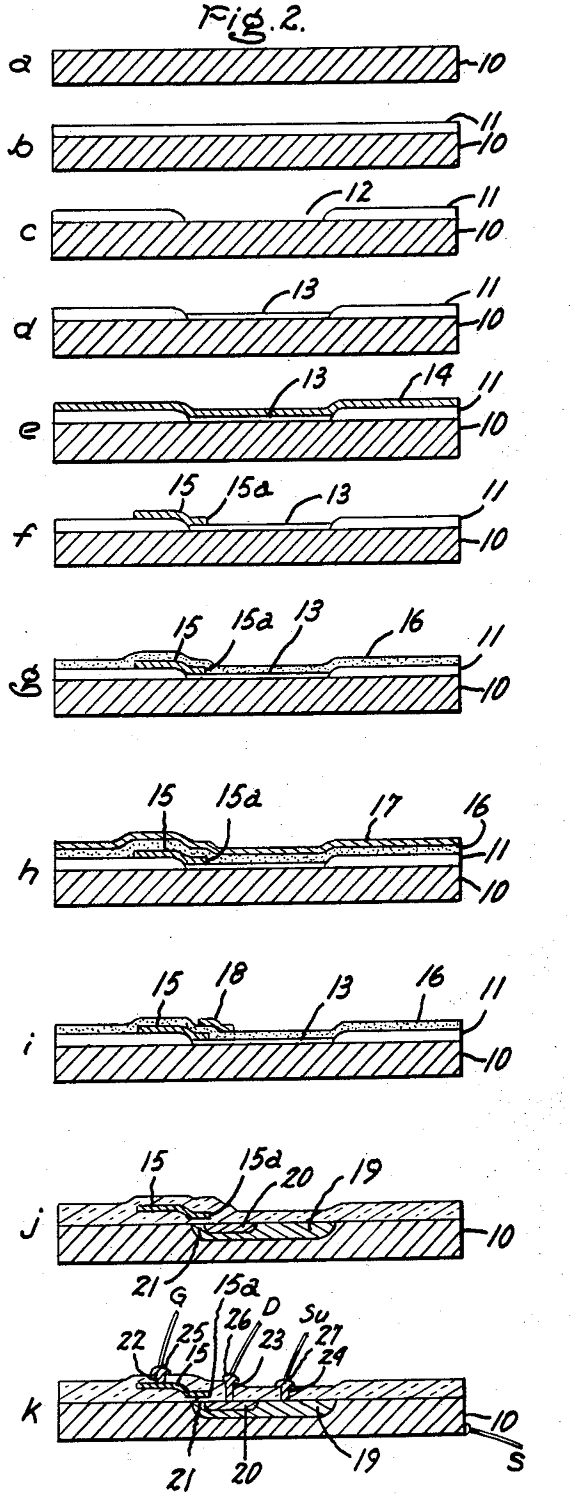

In FIGS. 1 and 2, an expletive method for fabricating a single field-effect transistor is illustrated; however, it is to be understood that a plurality of field-effect transistors could be and generally are fabricated in the same manner and at the same time. Additionally, it should be appreciated that the drawings herein are schematic and do not necessarily represent true dimensions or proportions because of the wide range of dimensions involved. Further, although the invention may be practiced using many semiconductor materials, such as germanium, gallium arsenide, etc., for ease of description, the invention will be described as practiced in forming silicon devices.

To begin this process, a suitable prepared wafer 10 of silicon is inserted in a reaction chamber and heated to a temperature of the order of 1,000° C to 1,200° C for approximately 24 hours in an atmosphere of pure dry oxygen to form a thermally-grown film 11 of silicon dioxide of approximately 1 micron thickness. After thermal growth, the oxide, commonly called the field oxide, may be annealed in an inert atmosphere, for example, helium to improve the oxide-silicon interface.

After the formation of the film 11 of silicon dioxide upon the wafer 10, a pattern 12 is formed in the oxide by selectively etching portions thereof away by a etchant which is reactive with the silicon dioxide such as buffered HF. The pattern may, for example, reveal 2 × 2 mil area of the wafer 10.

After patterning the thick oxide layer, the wafer is then reoxidized to form a thinner oxide layer 13 of, for example, 1,000 A.U. thickness or less within the patterned region 12. This thin oxide film 13, commonly called a gate oxide, may be formed in the same manner as the field oxide, but in this instance the wafer is maintained at an elevated temperature for a shorter period of time, for example, 1 to 2 hours.

After the formation of the gate oxide film 13, the wafer is coated with a conductive film 14 of a refractory metal, as, for example, molybdenum or tungsten which have good adherence characteristics to the silicon dioxide and are chemically inert in the presence of the silicon dioxide insulating film at diffusion temperatures, i.e., 1,000° – 1,100° C. Such a conductive film 14 may be formed upon the surface of the silicon dioxide by sputtering of a molybdenum target in a triode glow discharge of 0.015 Torr of argon, for example, for 15 minutes, while the substrate is maintained at a temperature of approximately 400° C. After approximately 15 minutes of sputtering, a thin molybdenum film 14 which may, for example, have a thickness of 5,000 A.U. is formed. The thickness of the molybdenum film is subject to great variation and may readily be controlled by length of exposure to the sputtered refractory metal. In operation, films of 100 A.U. to 10,000 A.U. may be formed and utilized in accord with the present invention.

In addition to using the refractory metals, other stable non-reactive conductive materials can be used. For example, deposited silicon could be used for the conductive film 14. Accordingly, it is to be understood that the invention is not limited to metals alone, but rather includes any conductive material which is non-reactive with the insulating film at diffusion temperatures and is capable of functioning as a diffusion mask.

Subsequent to the formation of the film 14, a pattern is formed in the molybdenum film by selectively etching portions thereof away by an etchant which is reactive with the conductive film to cause the dissolution thereof, but which is non-reactive with the passivating or insulating films 11 and 13. To accomplish this, conventional photolithographic techniques using photoresist and irradiation thereof are used. Suitable photoresists are well known to the art, and may, for example, by obtained from Eastman Kodak Company of Rochester, N.Y., one common photoresist being sold under the name of KPR. The photoresist is uniformly deposited, as for example, by coating over the surface of the conductive film and a suitable mask containing a pattern desired to be impressed upon the molybdenum film is placed thereover. The photoresist-covered wafer is irradiated by ultraviolet light through the photoresist mask and the portions thereof which are desired to be maintained are exposed while the portions which are desired to be removed are covered. Subsequent to the irradiation of the photoresist, the wafer is immersed in a suitable developer, such as, Eastman Kodak photoresist developer, to cause the unexposed photoresist to be removed and dissolved away, leaving the irradiated photoresist.

After developing, the photoresist and the wafer may be heated, for example, to a temperature of 150° C for a period of approximately 40 minutes, to cause the photoresist to harden to a degree commensurate with etch-masking. After hardening, the film is immersed in a suitable solvent for the conductive film; in the case of molybdenum, an orthophosphoric acid etchant comprising a mixture of 76 percent by volume of orthophosphoric acid, 6 percent by volume of glacial acetic acid, 3 percent by volume of nitric acid and 15 percent by volume of water, may be used. Since the orthophosphoric acid containing etchant removes molybdenum at a rate of approixmately 5,000 A.U. per minute, the thickness of the molybdenum film determines the length of the etch bath; the unmasked portion of a 5,000 A.U. thick molybdenum film is removed in approximately one minute.

The configuration of an etched molybdenum film 14, having a substantially rectangular configuration 15 with a channel-defining edge **15*a* overlying the thin oxide film 13**, is illustrated in FIG. 2*f*.

Subsequent to the patterning of the molybdenum film, a suitable activator-doped film 16 is deposited thereover. Since, in this embodiment, the wafer 10 possesses P-type conductivity characteristics and this is used as the source region, it is necessary to induce "-substrate" and drain regions therein having opposite conductivity-type characteristics. This may be achieved, for example, by depositing a donor-doped insulating material over the patterned molybdenum film, as for example, phosphorous-doped silicon dioxide glass. This may be achieved by the pyrolysis of ethyl orthosilicate and triethyl phosphate vapors in 10:1 volumetric ratio. To accomplish this, argon gas is bubbled through ethyl orthosilicate at a rate of 7 cubic feet per hour and through triethyl phosphate at a rate of 0.7 cubic feet per hour and the resultant vapors mixed and passed over the silicon wafer at a composite flow rate of 7.7 cubic feet per hour for example. With the heated wafer at a temperature of 800° C, approximately 3 minutes is sufficient to form a 1,000 A.U. thick film 16 of phosphorous-doped silicon dioxide. The concentration of phosphorus in the silicon dioxide glass and therefore the concentration of phosphorus which will be diffused into the silicon wafer may be varied by suitably adjusting the flow of argon over the impurity source. Also, obviously other sources of phosphorus, as for example, phosphorus oxychloride, POCl, may be used when desired. Also, other donor dopants such as arsenic, antimony and bismuth can be used, as appropriate.

After depositing the donor-doped insulating material over the surface of the wafer, an acceptor-doped insulating material, as for example, a boron-doped layer of silicon dioxide is next deposited, for example, by pyrolytic deposition from a mixture or argon saturated with ethyl orthosilicate and a minor quantity of triethyl borate. This may be done by bubbling dry argon through ethyl orthosilicate at a rate of approximately 7 cubic feet per hour and bubbling dry argon through triethyl borate at a rate of approximately 0.7 cubic feet per hour and passing the two combined flows at a rate of approximately 7.7 cubic feet per hour over the wafer while it is heated to a temperature of approximately 800° C for approximately 3 minutes for example. A thin film 17 of boron-doped silicon dioxide of approximately 1,000 A.U. is formed over the phosphorous-doped silicon dioxide film 16. The boron-doped silicon dioxide film 17 is then patterned by selective masking, irradiated and etched in a conventional manner such as that described above to produce a patterned region 18 as shown in FIG. 2*i*. Obviously other acceptor dopants such as aluminum, gallium and indium can be used, as appropriate.

The wafer is then heated, as for example, to a temperature of approximately 1,100° C for approximately 15 hours to cause penetration of the phosphorus atoms to pass through the thin gate oxide film 13 and diffuse into the silicon wafer 10, to form a "substrate" region 19 of N-type conductivity. As is illustrated in FIG. 2*j* of the drawing, lateral diffusion also occurs, thus providing an N-type region beneath the channel-defining edge 15*a* of the gate electrode. During this same diffusion time, the boron atoms within the patterned region 18 also pass through the oxide film 13 and a form a P-type region 20 within the substrate region 19. As also illustrated in FIG. 2*j*, a short N-type region 21 is formed under the channel-defining edge 15*a* of the gate electrode. This short N-type region 21, formed between the two P-type regions 10 and 20 and defining the channel between the source 10 and the drain region 20, is in substantial registry with the gate electrode. The registration of the short channel 21 with the gate electrode 15 results from the formation of the substrate and drain regions 19 and 20, respectively, by the difference in extent of lateral diffusion under the channel defining edge of the gate electrode.

Figure 5:
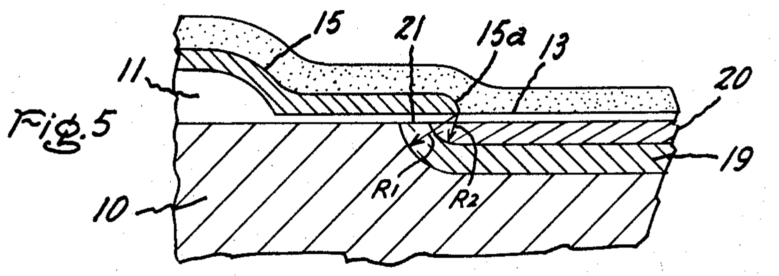
FIG. 5 is an enlarged view in vertical cross-section of a channel-defining edge of the gate electrode and short channel region.

FIG. 5 illustrates in greater detail the substantial registration of the channel defining edge 15*a* with the underlying surface-adjacent short channel defining edge 15 *a* with the underlying surface-adjacent short channel region 21. As illustrated, the extent of the lateral diffusion of substrate region 19 and drain region 20 under the gate electrode 15 is defined by radii or curvature $R_1$ and $R_2$, respectively, having their origin at the channel-defining edge 15*a*.

The length of the channel region between the drain and source regions depends on the thickness of the deposited phosphorous-doped and boron-doped silicon dioxide glasses and the diffusion times. The thicker the doped glass, the wider the channel. For example, a layer of 0.2 microns of phosphorous-doped silicon dioxide diffused through a layer of 0.2 microns of boron-doped silicon dioxide covered by a 0.2 micron layer of undoped silicon dioxide produces a channel region of 0.7 microns long about 2 hours of diffusion at 1,100° C. Longer channels may be obtained either by using thicker layers or by diffusion the first dopant into the wafer prior to the deposition of the second dopant. Separate diffusion steps are also generally necessary where lightly doped layers of phosphorous glass are used, as these layers penetrate the thin gate oxide 13 very slowly. Further, the concentration of impurities in the different diffusion regions is determined by the concentration of dopant in the silicon dioxide. Concentrations of from $10^{15}$ to solubility limit have been obtained in the aforementioned manner. In each situation, however, the short channel region 21 is in substantial registry with the channel-defining edge 15*a*.

To complete formation of the field-effect transistor of the above-described embodiment of the instant invention, the diffused oxide-coated wafer is masked by photoresist and etching techniques, as is described hereinbefore with respect to patterning the molybdenum and phosphorous films, and small contact apertures are etched through the oxide film to the gate, drain and substrate regions. The wafer is then immersed in a suitable etchant for silicon dioxide which may, for example, by a buffered HF solution comprising one part by volume of concentrated HF and 10 parts by volume of 40 percent solution of $NH_4F$. This etchant etches silicon dioxide at a rate of approximately 1,000 A.U. per minute and, thus, the etching process may be continued for a sufficient time to remove the desired thickness thereof without unduly contaminating the remainder of the wafer. FIG. 2*k* illustrates apertures 22, 23 and 24 etched into the gate, drain and substrate regions, respectively.

After etching of apertures 22, 23 and 24, the entire wafer may be metalized, the metal entering into each of the apertures to contact the gate, drain and substrate regions. Such metalizing may be done, for example, by vacuum evaporation of aluminum. Subsequent to metalization, the aluminum film so formed is patterned by photoresist and etching techniques to retain only restricted portions of the aluminum film corresponding to gate contact 25, drain contact 26, and substrate contact 27. A suitable etchant for aluminum is an orthophosphoric acid etchant comprising a mixture of 76 percent by volume of orthophosphoric acid, 6 percent by volume of glacial acetic acid, 3 percent by volume of nitric acid, and 15 percent by volume of water. Etching may be continued for approximately 90 seconds.

Electrical contact may be made to each of these contact surfaces by thermo-compression bonding, for example, or may be made by extending these regions to other entities upon the same substrate. The source region of the field-effect transistor is constituted by the original one-conductivity portion of wafter 10 and hence contact thereto may be made by alloying wafer 10 to a gold-plated header for example.

Figure 3:
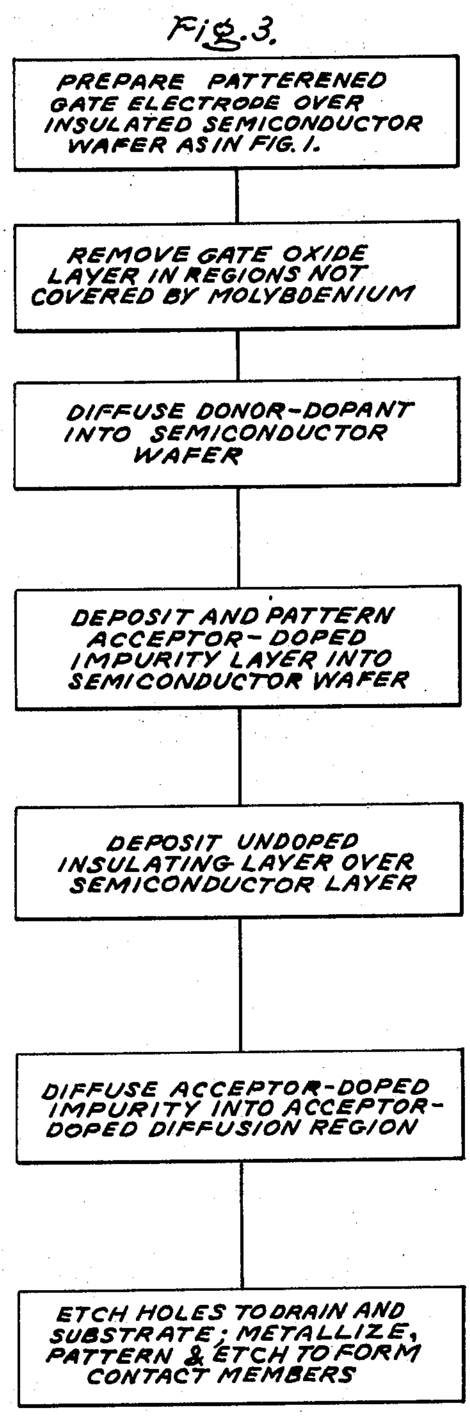
Figure 4:
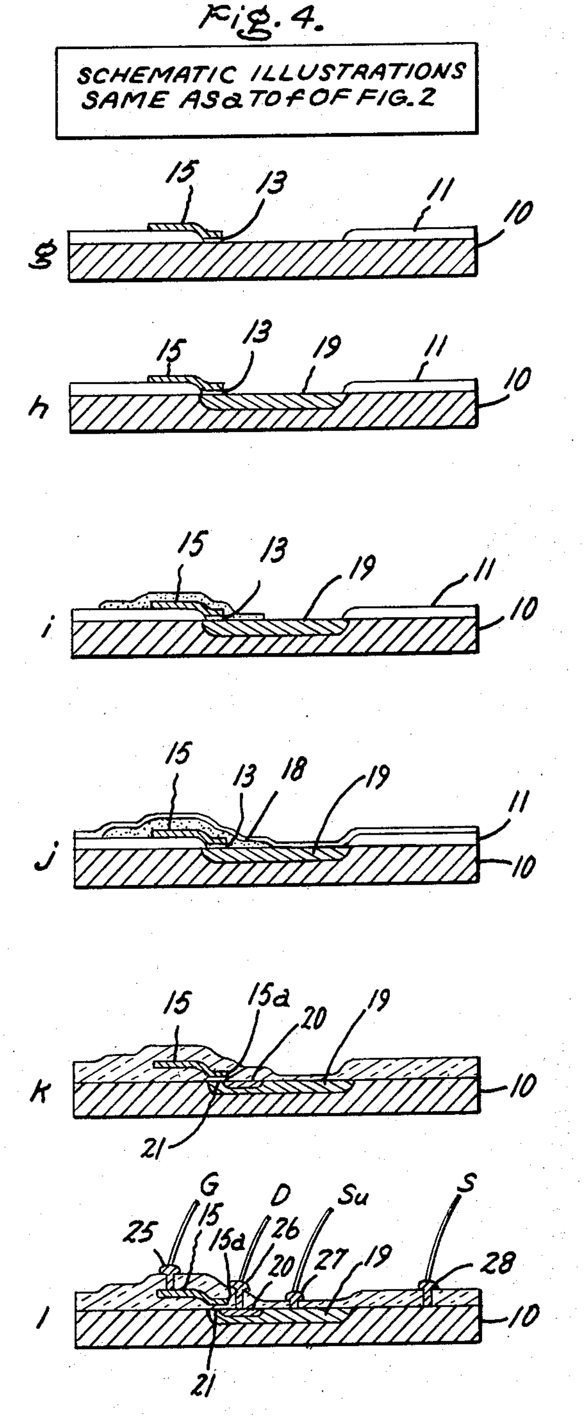

The foregoing description is directed to a method for making short channel field-effect transistors by the simultaneous diffusion of acceptor and donor-doped impurities through the gate oxide layer 13 and wherein the channel-defining edge was that of the gate electrode. An alternative method for making short channel field-effect transistors will now be described with reference to FIGS. 3 and 4 wherein the channel-defining edge is that of an insulating film. As illustrated in FIGS. 3 and 4, steps *a* through *f* of the process are the same as those described with reference to FIGS. 1 and 2. In the process now to be described with reference to FIG. 3, however, the gate oxide layer 13 is removed in all regions not covered by the patterned molybdenum gate electrode 15. An edge 13*a* of the remaining gate oxide 13 underlying the gate electrode serves as the channel-defining edge in this embodiment. The gate oxide may be removed with any of the conventional etchants which are reactive with silicon dioxide, such as, buffered HF. Into the surface exposed region of the wafer 10 is diffused a donor-dopant, as for example, phosphorus, to form a central "substrate" region 19 of N-type of conductivity. As is illustrated in FIG. 4*h* of the drawing, lateral diffusion also occurs thus providing an N-type region beneath the channel-defining edge 13*a* of the insulating film. The diffusion may, for example, be accomplished by placing the wafer 10 in close proximity to a source wafer containing the desired donor-impurity and heating in a vacuum the combination so as to diffuse the impurities from the source wafer into the exposed portion of the semiconductor wafer.

Subsequent to the donor diffusion, an acceptor-doped insulating material, as for example, a boron-doped layer of silicon dioxide 18 is deposited by pyrolytic deposition from a mixture of argon saturated with ethyl orthosilicate and a minor quantity of triethyl borate. This pyrolytic deposition may be performed as described above. The boron-doped silicon dioxide film thus deposited is then patterned by selective masking, irradiated and etched in a conventional manner to produce a patterned region 18 as illustrated in FIG. 4*i*.

Before diffusing the acceptor-doped impurities into the donor-doped diffusion region 19, an insulating layer is deposited over the surface of the wafer. This insulating layer is undoped and functions as a protective coating for the device during the diffusion process. The wafer is then heated, as for example, to a temperature of approximately 1,050° C for approximately 1 hour to cause penetration of the boron into the substrate region 19 to form a P-type diffusion region therein. As illustrated in FIG. 4*k*, the P-type diffusion region extends laterally under the channel-defining edge 13*a* of the gate oxide to form a short N-type region 21 between the two P-type regions. By photolithographic techniques, holes are etched to the drain, gate, substrate and source regions and a metalized pattern is formed over the surface of the oxide to form contact members 25, 26, 27 and 28 to each of the respective regions. Electrical contact is made to each of the contact members by thermo-compression bonding, for example, or may be made by extending these regions into other entities upon the same substrate. The resultant device, as illustrated in FIG. 41, is substantially the same as that illustrated in FIG. 2*k*.

Figure 6:
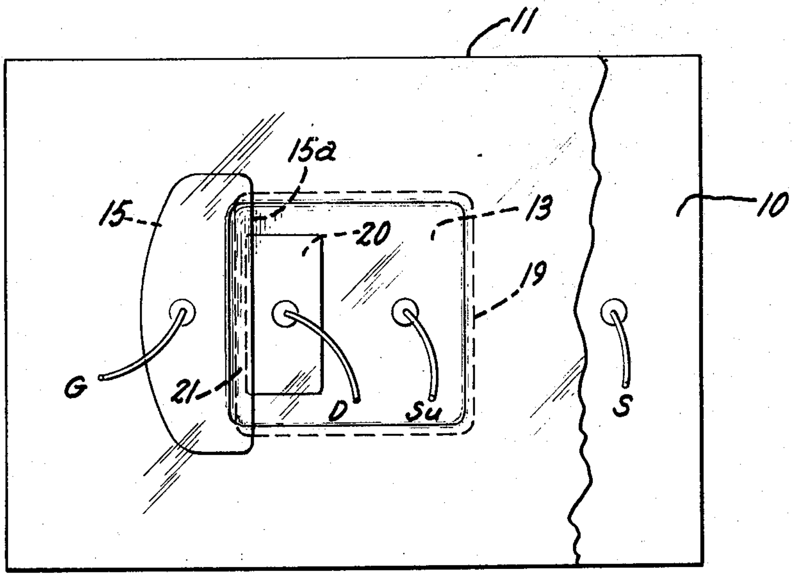
FIGS. 6 and 7 are schematic plan views of field-effect transistors fabricated in accord with the method of the flow diagrams of FIGS. 1 or 3.
Figure 7:
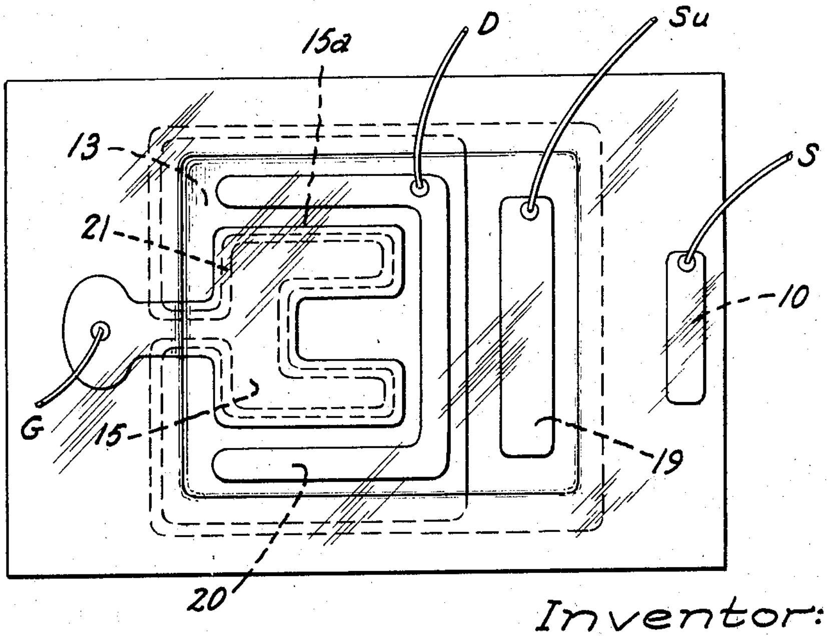

Devices fabricated in accord with the processes illustrated in the flow diagrams of FIGS. 1 and 3 are illustrated schematically in plan view in FIGS. 6 and 7, wherein the channel-defining edge, either that of the gate electrode or that of the insulating film, defines the boundary between the source and the channel regions and the drain and channel regions. FIG. 6 illustrates the wafer 10 with the thick insulating film of silicon dioxide 11 and a thinner film 13 within the region 12. The channel-defining edge 15*a* overlies the short channel 21 separating the drain region 20 from the substrate region 19 along a straight edge. FIG. 7 illustrates a U-shaped gate electrode 15 wherein the channel-defining edge 15*a* extends along the periphery of the U-shaped gate electrode. Such a device has greater current-carrying capability than the device of FIG. 6 because of the increase width of the channel region.

Although the foregoing descriptions have been directed to the fabrication of single field-effect transistors, it is to be understood that this was done merely for the purposes of the illustration. In a practical situation, any discrete devices are fabricated simultaneously on a single wafer and then separated by cleaving the wafer into many small dies. These dies, in turn, are mounted on a header and lead interconnections made by thermo-compression bonding in the conventional manner. In the alternative, devices thus formed together with other circuit components are interconnected to form integrated circuits. In this latter instant, a further feature of the invention may be realized.

Figure 8:
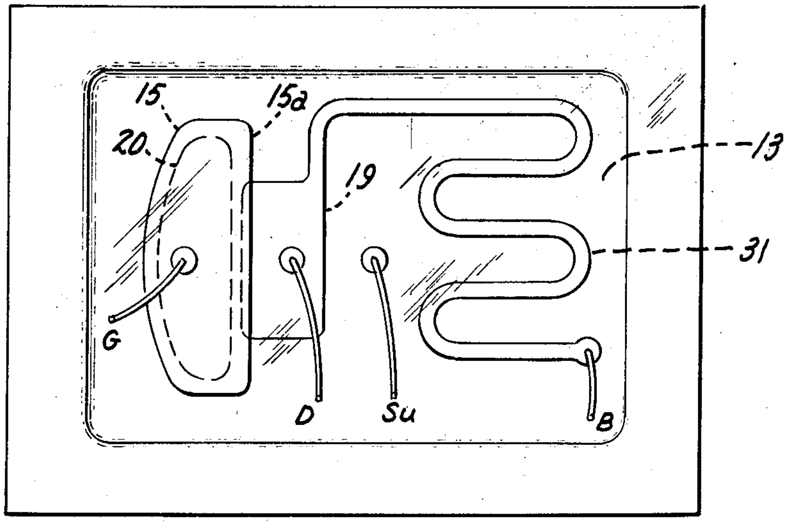
FIG. 8 is a schematic plan view of a field-effect transistor fabricated in accord with the methods of the flow diagrams of FIGS. 1 or 3 with a load resistor.

FIG. 8 illustrates a field-effect transistor fabricated in accord with the flow diagrams of either FIG. 1 or 3 and in addition includes a load resistor 31 formed by extending the acceptor-doped silicon dioxide film laterally to form a resistance element. Several attendant advantages are derived by forming a resistance element in this manner; namely, the resistance element is formed without the need for any additional process steps, the resistance element is electrically isolated from the substrate by the first diffused layer and may be made of any length and width appropriate for the particular circuit. Additionally, by merely changing the degree of doping, the resistivity of the element can be readily changed. Still an additional advantage of forming a resistance element in this manner is that it eliminates the need for using a second field-effect device as a load for a first field-effect device, thereby permitting usage of the second field-effect device for other purposes.

An alternate method for forming the resistance element is to etch an elongated slot into the field oxide 11 to reveal the underlying wafer 10 along the elongated slot. This is preferably done at the time when the pattern 12 is formed. The extremities of the slot may be widened if desired to provide a larger area for contact purposes. After processing the wafer as described above, first and second diffusion regions similar to those of the substrate and drain regions, respectively, will be formed in registry with the elongated slot to produce an isolated resistance element which may be connected with other circuit elements to perform desired functions. Connection may also be made to the first diffused region to prevent carrier injection through this region into the resistance element. Obviously the fabrication of arrays of resistance elements can be formed in this manner, if desired.

Figure 9:
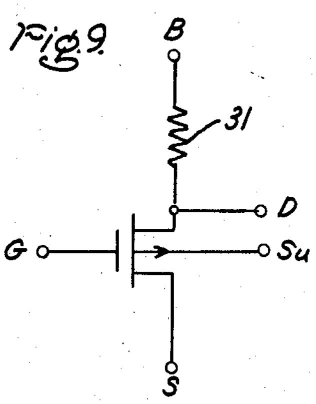
FIG. 9 is a schematic circuit diagram of the circuit of FIG. 8.
Figure 10:
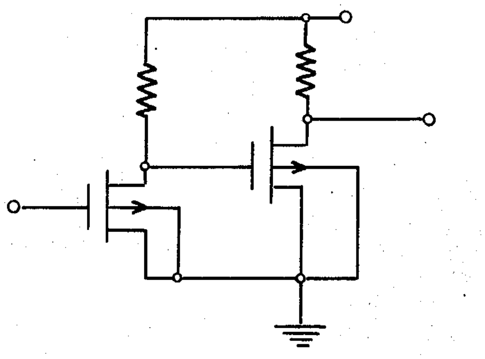
FIG. 10 is a schematic circuit diagram of two direct coupled field-effect transistors to form an amplifier integrated circuit.

FIG. 9 illustrates an electrical schematic diagram of the device illustrated in FIG. 8. Obviously, more complex circuits such as, for example, the amplifier circuit shown schematically in FIG. 10 can be interconnected to perform any of the numerous electrical functions desired.

Still other variations and modifications of the instant invention are contemplated; for example, the semi-conductor wafer need not be of a single-conductivity type, but may comprise a wafer having an epitaxial layer on one surface with the field-effect transistor devices formed in this layer. Also, the epitaxial layer need not be of the same conductivity type as the substrate, as for example, an N-type surface layer may be grown on a P-type wafer and N-channel devices formed on it. Portions of this layer may be electrically isolated from other portions as, for example, by diffusing a P-type region though the N-type layer. Narrow channel devices having source regions isolated electrically from other devices on the wafer may also be formed in this manner as dictated by the complexity of the circuit to be formed. Additionally, complementary mode devices may be formed by forming isolated islands on N-and P-type of semiconductor wafers and forming P-channel and N-channel devices, respectively, in these region. Accordingly, it can be readily appreciated that the instant invention makes available a wide variety of different devices and configurations.

To more specifically illustrate one embodiment of the instant invention, the fabrication of an N-channel enhancement mode field-effect transistor device as illustrated in FIGS. 3 and 4 of the drawing is constructed substantially as follows: A (1, 0, 0 ) surface, 1-inch diameter wafer of N-type silicon having a phosphorus concentration therein of 5 × $10^{15}$ atoms per cc and a thickness of 0.014 inches is carefully etched in "white etch" (3 parts HF: 1 part $HNO_3$), washed in distilled water, and heated in a reaction chamber in an atmosphere of dry oxygen at a temperature of 1,000° C for 6 hours to form a film 2,400 A.U. in thickness of silicon dioxide thereover. The wafer is annealed in helium at 1,000° C for 3 hours. A 3 mil square opening is etched through the silicon dioxide layer by conventional techniques. The wafer is then heated at a temperature of 1,000° C for 3 hours to form a film 1,200 A.U. in thickness of silicon dioxide thereover. The wafer is then heated to a temperature of 400° C while a 5,000 A.U. thick film of molybdenum is deposited thereon in a triode glow discharge with a molybdenum target in 0.015 Torr or argon for 20 minutes. A film of KPR photoresist is coated upon the surface of the molybdenum film and a mask having a patten corresponding to the gate region is superimposed over the wafer and the photoresist is irradiated therethrough. In this instance, a central 0.5 mil strip of molybdenum is left remaining within the 3 mil square gate oxide and extending over one edge of the field oxide for contact purposes. After irradiation, the wafer is immersed in photoresist developer, which removes the unirradiated portions of the photoresist and leaves the gate region pattern of irradiated portions thereon. The wafer is washed in distilled water and then immersed in an orthophosphoric acid etchant for approximately 1 minute to cause the removal of the molybdenum exposed through the photoresist pattern.

After removing the etchant and washing in distilled water, the wafer is washed in hot (approximately 180° C) concentrated sulphuric acid for a short time, e.g., 30 seconds, to remove the photoresist. The gate oxide layer 13 is then removed by suitable etching techniques in regions not covered by the molybdenum gate electrode. After removing the wafer from the etchant and washing in distilled water, the wafer is placed in a diffusion chamber opposite a source wafer having a concentration of boron equal to 2 × $10^{18}$ atoms per cc. The diffusion is performed at a temperature of 1,050° C for a period of 8 hours to yield to a diffusion depth of approximately 1 micron. A 1,000 A.U. thick layer of phosphorous-doped silicon dioxide is next formed on the wafer by pyrolysis of ethyl orthosilicate and phosphorus oxychloride, POCl, in a 10:1 volumetric ratio. This may be done by bubbling dry argon through ethyl orthosilicate at a rate of 7 cubic feet per hour and through POCl at a rate of 0.7 cubic feet per hour. The resultant vapors are mixed and passed over the silicon wafer at a composite flow rate of 7.7 cubic feet per hour. With the substrate wafer at a temperature of 800° C, approximately 3 minutes is sufficient to form a 1,000 A.U. thick film of phosphorous-doped silicon dioxide having a phosphorus concentration of 1 × $10^{20}$ atoms/cc in the diffused layer. The phosphorous-doped silicon dioxide film is then patterned by selective making and etched in a conventional manner, such as that described above, to produce a patterned layer of phosphorous-doped glass covering the exposed silicon on one side of the gate electrode and extending over it to 0.5 mils beyond the other edge of the gate electrode. The wafer is then covered with an undoped glass of silicon dioxide formed by the pyrolytic decomposition of pure ethyl silicate at 800° C in argon. The wafer is than placed in a diffusion chamber at a temperature of 1,050° C for approximately 1 hour to diffuse the phosphorus into the surface adjacent region of the wafer. An N-type diffusion region approximately 2,500 A.U. thick is formed within the P-type diffusion region. This produces a short channel region between the source and drain of less than 1 micron channel length.

Contacts to the source drain, gate and substrate are next formed by etching 0.5 mil slots through the oxide layer to contact the drain and "substrate" regions and a 0.25 mil diameter hole to contact the gate electrode over the field oxide and by depositing a layer of aluminum over the wafer. The aluminum layer is then masked and etched in a conventional manner to form electrode contacts. The aluminum is heated to approximately 500° C in a hydrogen atmosphere to reduce surface state densities. Electrical connection to the contacts is made by thermo-compression bonding.

An N-channel enhancement mode field-effect transistor, as illustrated diagrammatically in FIG. 8 with a load resistor integrally connected with the drain, is formed in the following manner. The preceding steps of fabricating an N-channel field-effect transistor are used to the point where the phosphorous-doped glass is patterned, except that the opening in the field oxide is extended on one side of the gate electrode. A pattern is then formed in the phosphorous-doped glass by conventional photolithographic techniques as described above so that the exposed silicon on one side of the gate electrode is covered by the glass. The gate electrode and a region 0.5 mils beyond the gate electrode edge are also covered by the glass. Extending from this second region, a 0.25 mil wide serpentine-like strip of phosphorous-doped glass is left remaining having a total length of 25 mils and an enlarged end for contact purposes. This forms the resistance element after diffusion with a resistance of 5,000 ohms.

The wafer is then heated to a temperature of 1,100° C for 3 hours in an atmosphere of argon and carbon dioxide to cause the dopants to diffuse through the thin gate oxide into the silicon wafer. The diffusion of the phosphorus causes the formation of an N-type region having a sheet resistance of 50 ohms per square and the diffusion of the boron causes the formation of a P-type region ahead of the N-type region. Under the channel-defining edge of the gate electrode is formed a short P-type channel region. The resistance element is formed by diffusion into the source region of the wafer and hence remains as an isolated resistance element separated from other wafer regions by the more deeply diffused P-region.

Contacts to the drain, gate, source, substrate and resistance element are next formed as in the previous illustration.

While the foregoing description illustrated the fabrication of specific semiconductor devices in accord with an embodiment of the present invention, it is to be understood that these illustration are for purposes of better understanding the invention and are not to be construed in a limiting sense. Further, although several embodiments of the invention illustrate the channel-defining edge as a substantially straight line or U-shaped edge, it is to be understood that other configurations are contemplated such as annular, arcuate, rectangular, finger-shaped, etc. The specific configuration is a matter of design choice necessitated by the requirements of the device. For example, to fabricate devices with increased power handling capability, it is only necessary to increase the width of the channel region. This may be accomplished, for example, by using a finger-shaped gate electrode which provides an increased periphery with a resultant increase in the width of the channel region.

From the foregoing, it is apparent that there is disclosed a new and useful family of enhancement type field-effect transistors having an exceedingly short channel length defined by a single edge of the gate electrode. FIeld-effect transistor devices made in accord with the instant invention exhibit improved transconductance characteristics and high gain-bandwidth products than those of the prior art. Additionally, there is disclosed a method for making integrated circuits utilizing short channel field-effect devices with resistance elements formed as a part of the transistor fabrication process.

While the invention has been set forth herein with respect to certain specific examples and embodiments thereof, many modifications and changes will readily occur to those skilled in the art.

What I claim as new and desire to secure from Letters Patent of the United States is:

1. A method of making an insulated field-effect transistor having a short channel region comprising:

forming an insulating layer over a semi-conductor wafer having a major portion of a first-conductivity type;

forming a gate electrode over said insulating layer;

diffusing an opposite conductivity type impurity into said wafer to form a surface-adjacent substrate region therein in the vicinity of said gate electrode;

diffusing a first conductivity type impurity within the substrate from a patterned activator-doped insulating layer overlying a portion of said substrate diffusion region in the vicinity of said edge of said gate electrode to produce a drain region therein, the remaining opposite conductivity-type region forming said short channel region covered by a portion of said gate electrode; and forming electrical contacts to said different conductivity-type regions and said gate electrode.

2. A method of claim 1 wherein said substrate region is formed by diffusing from a first activator-doped insulating layer overlying said wafer in the vicinity of said edge of said gate electrode.

3. The method of claim 4 further comprising forming a resistance element in said substrate region.

4. The method of claim 1 wherein the length of said short channel region underlying said edge of said gate electrode is equal to the difference in extent of lateral diffusion of said substrate region and said drain region with respect to said edge of said gate electrode.

5. The method of claim 4 wherein the length of said channel region is less than 1 micron.

6. A method of forming a short channel field-effect transistor comprising:

forming an insulating film over a major surface of a first-conductivity-type semiconductor wafer;

overlaying said insulating film with a conductive film which is non-reactive with said insulating film at conductivity-modifying activator diffusion temperatures;

forming a pattern in said conductive film of conductor-removed and conductor-remaining portions, one of said conductor-remaining portions serving as a gate electrode for said field-effect transistor;

forming an aperture in said insulating film adjacent an edge of said gate electrode;

diffusing a first activator impurity through said aperture to transform the major surface adjacent region of said wafer in the vicinity of said gate electrode to an opposite conductivity-type region;

diffusing from a patterned activator-doped insulating film overlying said wafer a second activator impurity into the surface adjacent opposite-conductivity-type diffusion region to transform a portion of the opposite-conductivity-type region to said first-conductivity-type, the remaining opposite-conductivity-type region forming a short channel region covered by a portion of said gate electrode; and forming electrical contacts to each of said different conductivity-type regions and said gate electrode.

7. The method of claim 6 wherein said semiconductor wafer is silicon having a surface of P-type conductivity and said first activator impurity is selected from the group consisting of phosphorus, arsenic, antimony and bismuth and said second activator impurity is selected from the group consisting of boron, aluminum, gallium and indium and said field-effect transistor is an N-channel enhancement mode type transistor.

8. The method of claim 6 wherein said semiconductor wafer is silicon having a surface of N-type conductivity and said first activator impurity is selected from the group consisting or boron, aluminum, gallium and indium and said second activator impurity is selected from the group consisting of phosphorus, arsenic, antimony and bismuth and said field-effect transistor is a P-channel enchancement mode type transistor.

9. The method of claim 1 wherein said edge of said gate electrode defines the boundaries of said short channel region.

10. The method of claim 1 wherein an edge of said insulating film adjacent said aperture and underlying said gate electrode defines the boundaries of said short channel region.

11. The method of claim 1 wherein said conductive film is selected from the group consisting of molybdenum, tungsten and silicon.

12. The method of claim 1 wherein said activator-doped insulating film is extended linearly to form a resistance element.

* * * * *